United States Patent [19]

Chou et al.

[11] Patent Number: 5,731,236
[45] Date of Patent: Mar. 24, 1998

[54] PROCESS TO INTEGRATE A SELF-ALIGNED CONTACT STRUCTURE, WITH A CAPACITOR STRUCTURE

[75] Inventors: Chen Cheng Chou, Taichung; Jenn Tsao, Taipei, both of Taiwan

[73] Assignee: Taiwan Semiconductor Manufacturing Company, Ltd., Hsin-chu, Taiwan

[21] Appl. No.: 851,400

[22] Filed: May 5, 1997

[51] Int. Cl.⁶ .................................................. H01L 21/8242
[52] U.S. Cl. .......................... 438/253; 438/396; 438/239; 438/253; 438/637
[58] Field of Search .......................... 438/238, 239, 438/241, 253, 381, 396, 637, 640, 701

[56] References Cited

U.S. PATENT DOCUMENTS

| | | | |
|---|---|---|---|
| 5,075,246 | 12/1991 | Re et al. | 148/DIG. 14 |
| 5,173,437 | 12/1992 | Chi | 438/253 |
| 5,286,667 | 2/1994 | Lin et al. | 438/396 |
| 5,304,829 | 4/1994 | Mori et al. | 257/324 |
| 5,318,925 | 6/1994 | Kim | 438/396 |
| 5,364,804 | 11/1994 | Ho et al. | 437/41 |
| 5,397,722 | 3/1995 | Bashir et al. | 437/41 |

*Primary Examiner*—Tuan H. Nguyen
*Attorney, Agent, or Firm*—George O. Saile; Stephen B. Ackerman

[57] ABSTRACT

A semiconductor fabrication process, allowing integration of MOSFET devices, and capacitor structures, on a single semiconductor chip, has been developed. The process integration features the use of a MOSFET device, fabricated using a self-aligned contact structure, allowing a reduction in the source and drain area needed for contact. Silicon nitride spacers, used on the sides of the polysilicon gate electrode, protect the polysilicon gate structure, during the opening of a self-aligned contact hole. A self-aligned contact opening, to a source and drain region of a MOSFET device, as well as a capacitor contact opening, to a capacitor structure, are formed using wet-dry etching combinations. These etching combinations result in openings exhibiting sloped profiles, allowing for the attainment of reliable metal coverage, even with the use of sputtered metal depositions.

22 Claims, 5 Drawing Sheets

PROCESS TO INTEGRATE A SELF-ALIGNED CONTACT STRUCTURE, WITH A CAPACITOR STRUCTURE

BACKGROUND OF THE INVENTION

(1) Field of the Invention

The present invention relates to the fabrication of semiconductor devices, and more specifically to a fabrication sequence used to integrate a metal oxide semiconductor field effect, (MOSFET), device, and a capacitor structure, on a single semiconductor chip.

(2) Description of Prior Art

The semiconductor industry is continually striving to improve the performance of semiconductor devices, while still attempting to reduce the cost of these same devices. These objectives have been successfully addressed by the ability of the semiconductor industry to practice micro-miniaturization, or to fabricate semiconductor devices with sub-micron features. Several fabrication disciplines, such as photolithography, as well as dry etching, have allowed micro-miniaturization to be realized. The use of more sophisticated exposure cameras, as well as the use of more sensitive photoresist films, have allowed the attainment of sub-micron images in photoresist films, to be routine achieved. In addition the development of more advanced dry etching tools and processes, have allowed the sub-micron images, in masking photoresist films, to be successfully transferred to underlying materials used for the fabrication of semiconductor devices.

In addition to advances in semiconductor fabrication disciplines, several device structural innovations have also contributed to the quest for higher performing, lower cost, semiconductor devices. For example the use of a self-aligned contact, (SAC), procedure, allows the amount of source and drain contact area to be reduced, thus allowing smaller devices to be constructed, resulting in faster, as well as lower cost devices, to be realized. The SAC procedure, using a sub-micron groundrule, opens a sub-micron region in an insulator layer, exposing an underlying source and drain region. However only a portion of the sub-micron SAC opening is used to expose the underlying source and drain region, with the remainder of the sub-micron SAC opening overlapping an adjacent polysilicon gate structure. Therefore the source and drain contact region is smaller then the SAC opening. If the contact opening to the source and drain was to made entirely overlaying the source and drain region, the source and drain region would have to be designed larger, to accommodate the fully landed contact hole opening, thus resulting in a undesirable, larger semiconductor device. In addition to the cost and performance benefits of devices fabricated using the SAC procedure, a silicon nitride sidewall spacer can also be used, allowing the SAC opening to be created, exposing the insulator sidewall of a polysilicon gate structure. The use of silicon nitride, in place of a silicon oxide spacer, allows a greater degree of insulator integrity, when the metal contact structure is formed in the SAC opening.

This invention will describe a process for integrating a MOSFET device and a capacitor structure, a combination that can be used for a non-volatile, EEPROM chip. The invention will feature a novel process integration sequence, incorporating the SAC structure, using a sub-micron diameter opening, and the use of silicon nitride spacers, used to prevent shorting metal shorting between the MOSFET device and the capacitor structure. In addition this invention will feature etching procedures for both the SAC opening, and a capacitor contact opening, using a dry-wet etching process for the SAC opening, after using a wet-dry process for the capacitor contact opening. The novel etching combination allows openings with sloped or tapered profiles, conducive to obtaining adequate metal coverage, even when using non-CVD, (chemically vapor deposited), metallizations, such as aluminum. Prior art, such as Ho, et al, in U.S. Pat. No. 5,364,804, describes a SAC procedure, however that invention does not incorporate the silicon nitride spacer, nor does that invention describe the process integration featured in this invention, specifically the etching combinations used for the SAC and capacitor openings.

SUMMARY OF THE INVENTION

It is an object of this invention to demonstrate a fabrication process for integrating a MOSFET device and a capacitor structure, on a single semiconductor chip.

It is another object of this invention to use silicon nitride spacers, on the sides of a polysilicon gate structure, of a MOSFET device, to improve the insulator integrity in the sub-micron diameter SAC opening.

It is yet another object of this invention to create a SAC structure to a source and drain region of a MOSFET device, featuring a sub-micron diameter, SAC opening, in a thick interlevel insulator layer, with the sub-micron diameter, SAC opening exhibiting a sloped profile, obtained via use an initial dry etch procedure, and completed using a wet etch process.

It is still yet another object of this invention to create a sloped opening, in a thick interlevel insulator layer, to a capacitor structure, by first using a wet etching cycle, and then completed using dry etching procedures.

In accordance with the present invention a process for integrating a MOSFET device structure, featuring a SAC structure with silicon nitride spacers, with a capacitor structure, featuring a composite capacitor dielectric layer of silicon nitride-silicon oxide, on a semiconductor substrate, is described. The growth of a gate insulator layer is followed by the deposition and doping of a polysilicon layer. A thin layer of silicon oxide is thermally grown on the polysilicon layer, followed by the deposition of a thin silicon nitride layer, both layers to be used for the composite dielectric layer of a capacitor structure. An overlying first silicon oxide layer is next deposited. Patterning is next performed to define a structure in the first silicon oxide, thin silicon nitride, thin silicon oxide, and polysilicon layer, to create the shape to be used for a polysilicon gate structure, on the gate insulator layer, while the same patterning procedure is used to create the lower electrode of the capacitor structure, on a FOX region. A sidewall silicon oxide layer is thermally grown on the exposed polysilicon sides, for both the gate and capacitor structures. A layer of silicon nitride is then deposited and subjected to an anisotropic dry etching procedures to create silicon nitride spacers, on the sides of the polysilicon gate, and capacitor structures. Source and drain regions are next formed in the MOSFET region, in an area not covered by the polysilicon gate structure. A thick interlevel dielectric layer is deposited and planarized, creating a smooth top surface of the interlevel dielectric layer. Photolithographic procedures are next employed to expose a region to be used for the opening to the capacitor structure. A wet etch procedure is first used to remove a portion of the thick interlevel insulator layer, and to create the desired profile for the capacitor contact opening, followed by completion of the capacitor contact opening, using a selective dry etch procedure, removing the remaining thick interlevel insulator layer, and thick silicon oxide layer, and exposing the top surface of the thin silicon nitride layer. Another photolithographic and etching procedure is next used to create a sub-micron diameter, SAC opening in the interlevel dielectric layer, with the SAC opening partially overlying the silicon nitride spacer, of the polysilicon gate structure, exposing an area of the underlying source and drain region. This etching procedure is comprised of an initial dry etch, and completed using wet etching processing, again in an attempt to create openings with the desired sloped profile. Metal deposition, and patterning are used to create the SAC structure to the MOSFET source and drain regions, in the sloped, sub-micron diameter, SAC opening, as well as creating the upper electrode shape of the capacitor structure, in the sloped, capacitor contact opening.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of simultaneously fabricated a MOSFET device, using a SAC structure, and a capacitor structure, both featuring silicon nitride spacers, and both residing in sloped openings, will now be covered in detail. In this description the MOSFET device described is a p-channel, (PFET), device. However this invention is also operable using n-channel, (NFET), devices, or complimentary, (CMOS), devices, in which both NFET and PFET devices, with SAC structures and silicon nitride spacers, are simultaneously fabricated with a capacitor structure.

Figure 1:
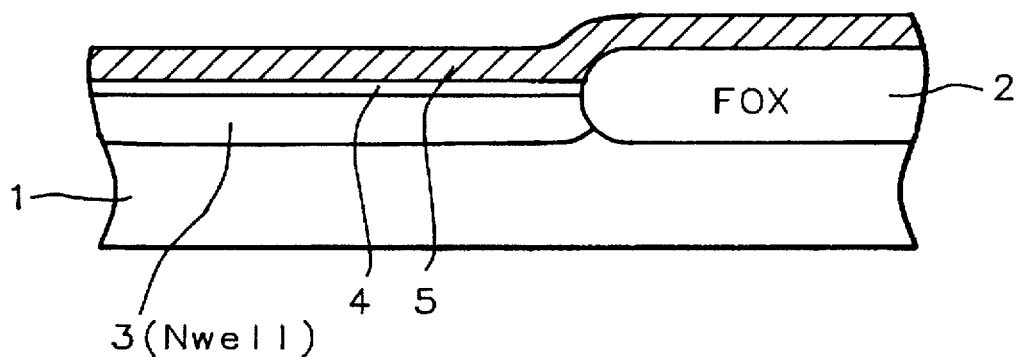
FIGS. 1–9, which schematically, in cross-sectional style, describe an integration process, used to simultaneously fabricate a MOSFET device, with a capacitor structure, with the MOSFET device featuring a SAC structure, placed in a sloped, sub-micron diameter, SAC opening, while the capacitor structure also features a sloped, capacitor contact opening.

FIG. 1, schematically shows the early stages of fabrication of this invention. A P type semiconductor substrate 1, with a <100> crystallographic orientation, is used. Field oxide, (FOX), region 2, is formed for isolation purposes, as well as to provide a base for a subsequent capacitor structure to be fabricated on. FOX region 2, is formed via thermal oxidation, of exposed semiconductor substrate 1, in an oxygen–steam ambient, at a temperature between about 850° to 1050° C., to a thickness between about 3000 to 5000 Angstroms. Subsequent device regions, or regions not converted to FOX region 2, are protected by a masking pattern of an oxidation resistant composite layer, comprised of an overlying silicon nitride layer, on an underlying pad silicon oxide layer. The desired masking pattern, of the oxidation resistant composite layer, is obtained via conventional photolithographic and dry etching procedures. After formation of the FOX region 2, the masking pattern is removed, using hot phosphoric acid for silicon nitride, and a buffered hydrofluoric acid solution for the pad oxide. An N well region 3, is next formed via ion implantation of phosphorous, at an energy between about 50 to 200 KeV, at a dose between about 2E12 to 3E13 atoms/cm$^2$. The MOSFET device described in this invention will be a PFET device, thus necessitating the creation N well region 3. However NFET devices can also be fabricated, along with the PFET devices, necessitating the use of a photolithographic procedure used to block a subsequent NFET region from the ion implantation procedure, used for N well creation. A gate insulator layer 4, comprised of silicon dioxide, is next formed via thermal oxidation, in an oxygen–steam ambient, at a temperature between about 850° to 1000° C., to a thickness between about 50 to 200 Angstroms. An intrinsic layer of polysilicon layer 5, is then deposited, using low pressure chemical vapor deposition, (LPCVD), techniques, at a temperature between about 550° to 650° C., to a thickness between about 2000 to 4000 Angstroms. A POCl$_3$ procedure is next employed, at a temperature between about 900° to 1000° C., to dope polysilicon layer 5, to a surface concentration between about 1E20 to 1E21 atoms/cm$^3$. Polysilicon layer 5, can also be doped via ion implantation procedures using phosphorous or arsenic, or polysilicon layer 5, can be deposited using in situ doping procedures, via the addition of either arsine or phosphine to a silane ambient.

Figure 2:
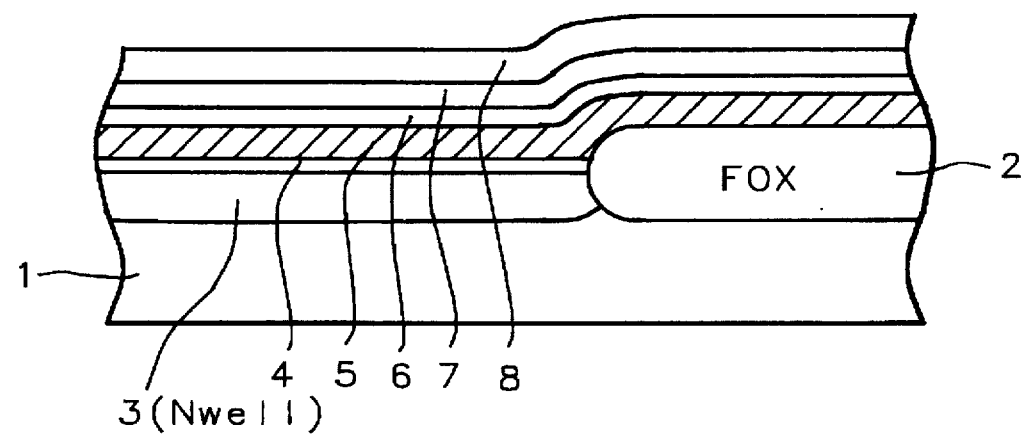

A thin silicon oxide layer 6, shown schematically in FIG. 2, is next thermally grown from polysilicon layer 5, in an oxygen–steam ambient, at a temperature between about 850° to 950° C., to a thickness between about 50 to 250 Angstroms. Thin silicon oxide layer 6, will be subsequently used as a capacitor dielectric layer. A thin silicon nitride layer 7, is next deposited, using LPCVD or plasma enhanced chemical vapor deposition, (PECVD), procedures, at a temperature between about 600° to 850° C., to a thickness between about 200 to 1000 Angstroms. Thin silicon nitride layer 7, will also be used for a capacitor dielectric layer. Another LPCVD or PECVD procedure then employed to deposit first silicon oxide layer 8, at a temperature between about 500° to 800° C., to a thickness between about 100 to 1000 Angstroms, using tetraethylorthosilicate, (TEOS), as a source. This is schematically shown in FIG. 2.

Figure 3:
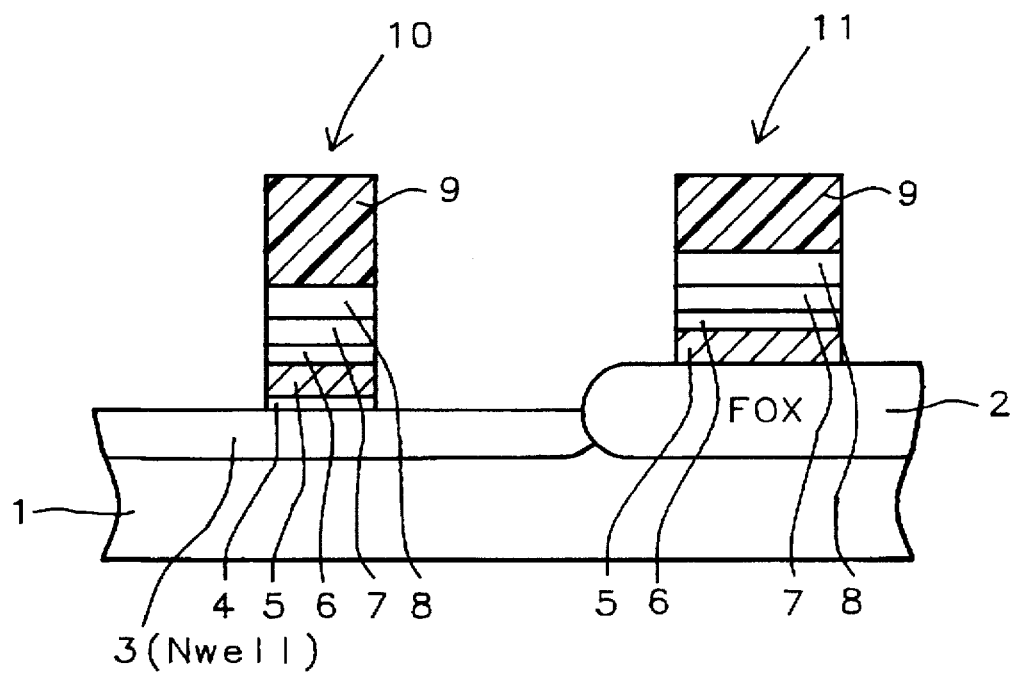

FIG. 3, schematically shows the result of patterning procedures, used to create the shape for a polysilicon gate structure 10, used for the MOSFET device, and for a lower electrode shape for a capacitor structure, 11. A photoresist shape 9, is used as a mask to allow transfer of this shape, via reactive ion etching, (RIE), procedure, to the underlying layers, using CHF$_3$ as an etchant for first silicon oxide layer 8, thin silicon nitride layer 7, and thin silicon oxide layer 6, and using Cl$_2$ as an etchant for polysilicon layer 5, creating the desired structures, the polysilicon gate structure 10, of the MOSFET device, and the lower electrode shape for capacitor structure 11. Photoresist shape 9, is removed via plasma oxygen ashing and careful wet cleans. A post RIE procedure, in a buffered hydrofluoric acid solution, removes gate insulator layer 4, from areas not protected by polysilicon gate structure 10.

Figure 4:
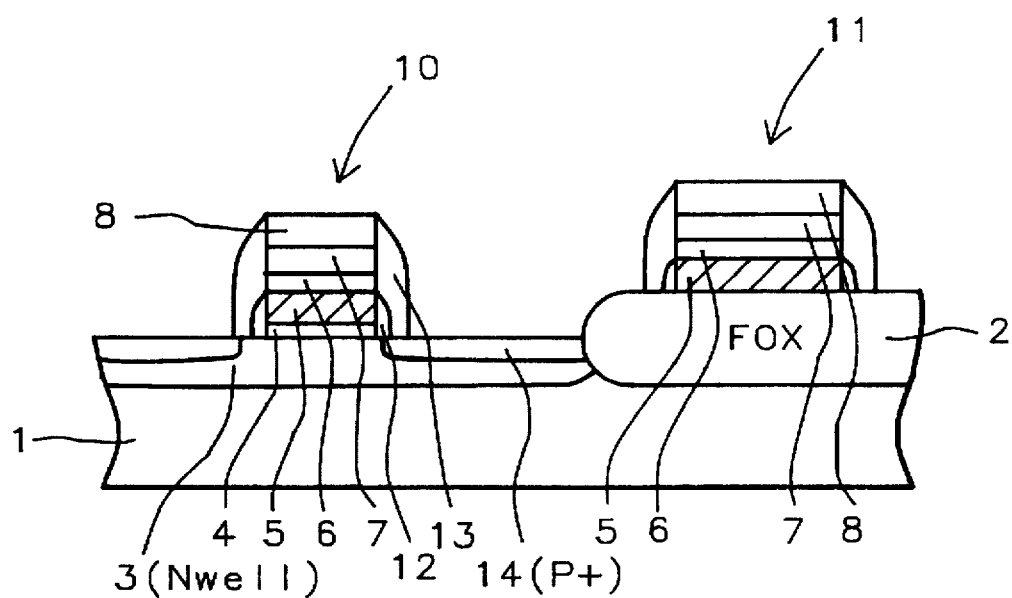

A sidewall silicon oxide layer 12, is next formed on the exposed sides of polysilicon shapes, via thermal oxidation procedures, in an oxygen–steam ambient, at a temperature between about 800° to 950° C., to a thickness between about 75 to 100 Angstroms. Silicon nitride spacers 13, are next formed on the sides of polysilicon gate structure 10, and on the sides of capacitor structure 11. Silicon nitride spacers 13, are created by first depositing a layer of silicon nitride, via LPCVD or PECVD procedures, at a temperature between about 700° to 850° C., to a thickness between about 1000 to 3000 Angstroms, followed by an anisotropic RIE procedure, using SF$_6$ or CHF$_3$ as an etchant, creating silicon nitride spacers 13, and shown schematically in FIG. 4. A P type, source and drain region 14, is next formed via ion implantation of either B$^{11}$ or BF$_2$, at an energy between about 15 to 40 KeV, at a dose between about 8E14 to 6E15 atoms/cm$_2$. If this invention would to include NFET, as well as PFET devices, photoresist masking procedures would be employed to block out NFET regions from the P type source and drain ion implantation procedures, while similar blockouts would be used to protect PFET regions during an N type source and drain formation, used to fabricate the NFET devices. In addition first silicon oxide layer 8, protects the subsequent capacitor structure 11, from this ion implantation process.

Figure 5:
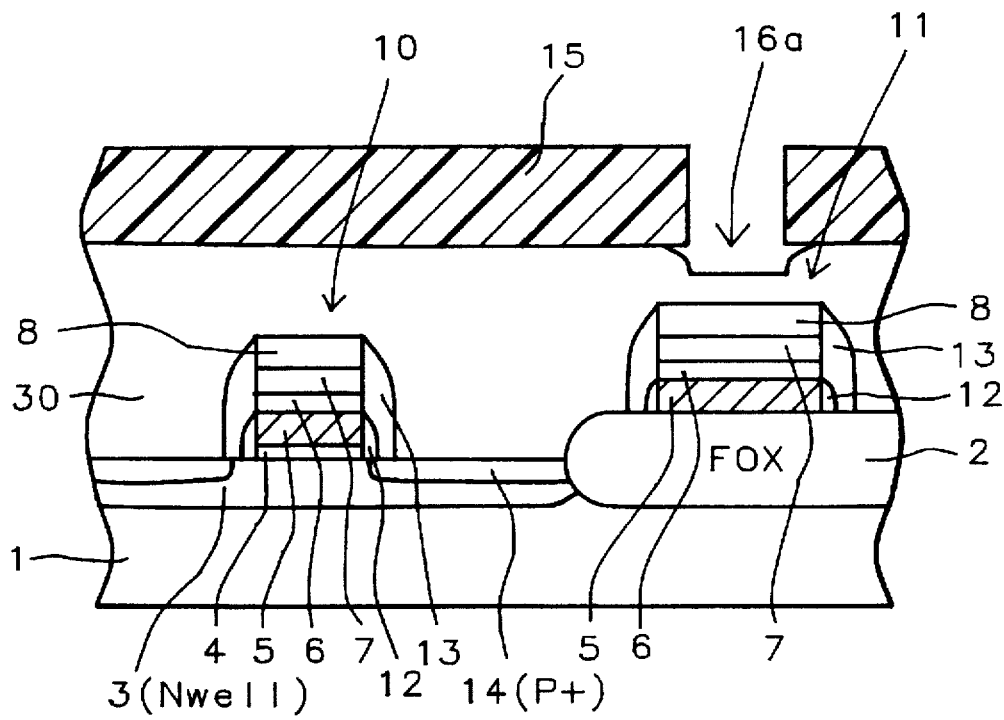
Figure 6:
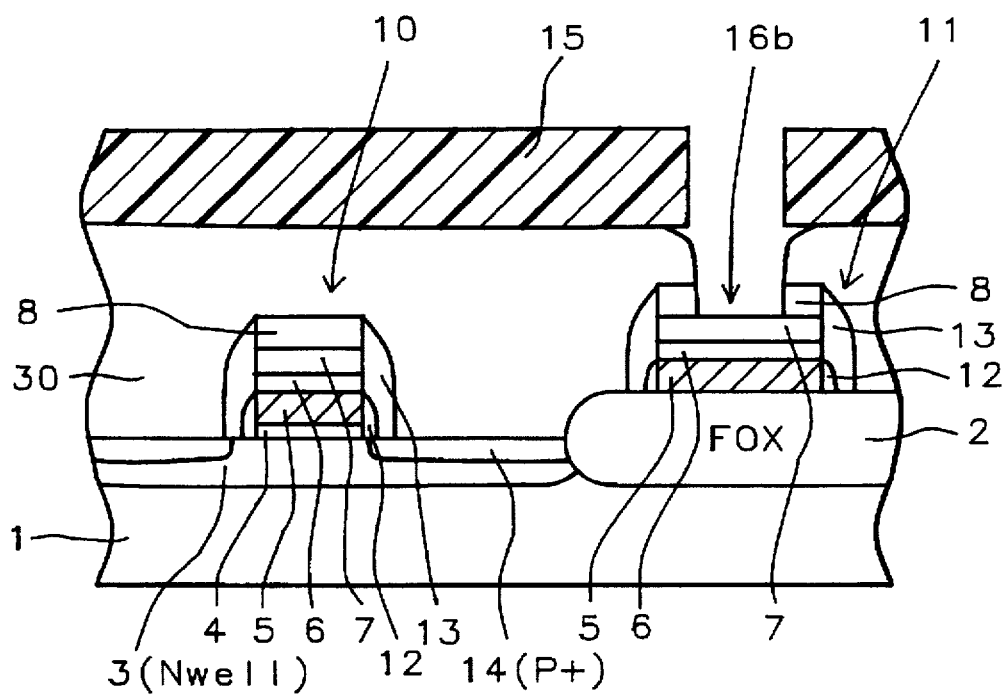

A composite insulator layer of undoped silicate glass, (USG), and a boro-phosphosilicate glass, (BPSG), is next deposited, using PECVD procedures, at a temperature between about 300° to 500° C., to a thickness between about 3000 to 10000 Angstroms. The USG/BPSG interlevel dielectric layer, (ILD) 30, is subjected to a planarization procedure, using chemical mechanical polishing techniques, to create a smooth top surface. This is schematically shown in FIG. 5. A photoresist shape, 15, is formed on ILD layer 30, exposing a region used to define the contact dimension of an capacitor upper electrode. A wet etch procedure, using a buffered hydrofluoric acid solution is used to remove between about 800 to 1500 Angstroms of ILD layer 30, creating the initial phase, capacitor contact opening 16a. (ILD layer 30, was originally deposited to a thickness between about 3000 to 10000 Angstroms. This is schematically shown in FIG. 5. The final capacitor contact opening 16b, is created via use of a selective, anisotropic dry etching procedure, using $CHF_3$ as an etchant. This phase of the capacitor contact opening entails removal of the remaining ILD layer 30, and the complete removal of first silicon oxide layer 8, exposing the top surface of silicon nitride layer 8, in capacitor contact opening 16b. Capacitor contact opening, 16b, schematically shown in FIG. 6, has a tapered or sloped profile near the surface of ILD layer 30, created as a result of the initial phase of formation, using wet etching procedures. This profile will allow acceptable metal coverage, in capacitor contact opening 30, to result, even when using non-CVD deposited metallizations, such as sputtered aluminum. Photoresist shape 15, is removed via plasma oxygen ashing and careful wet cleans.

Figure 7:
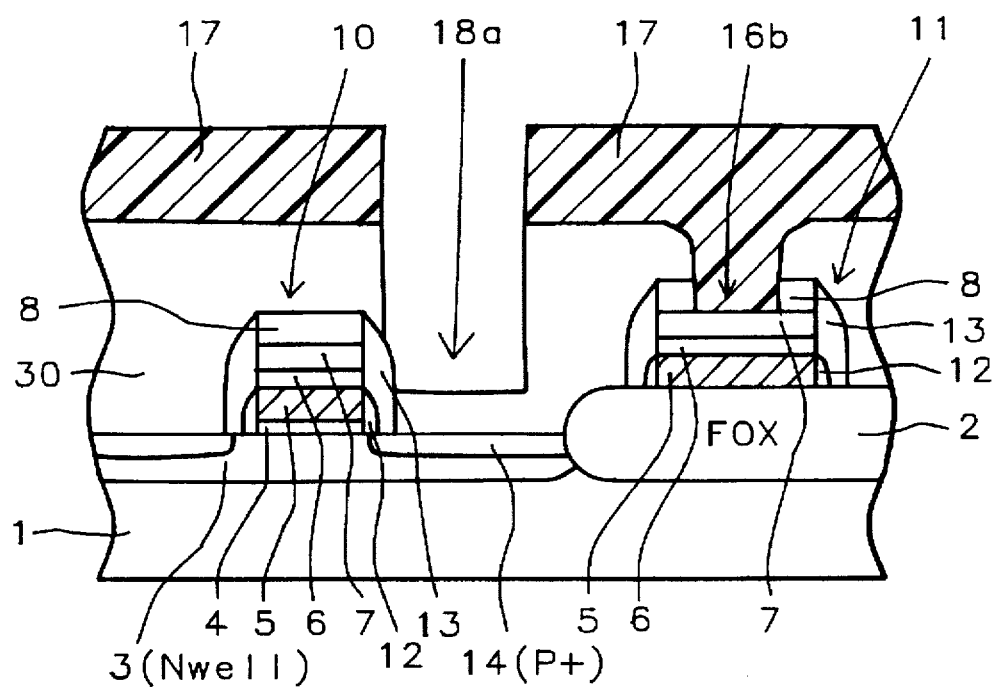
Figure 8:
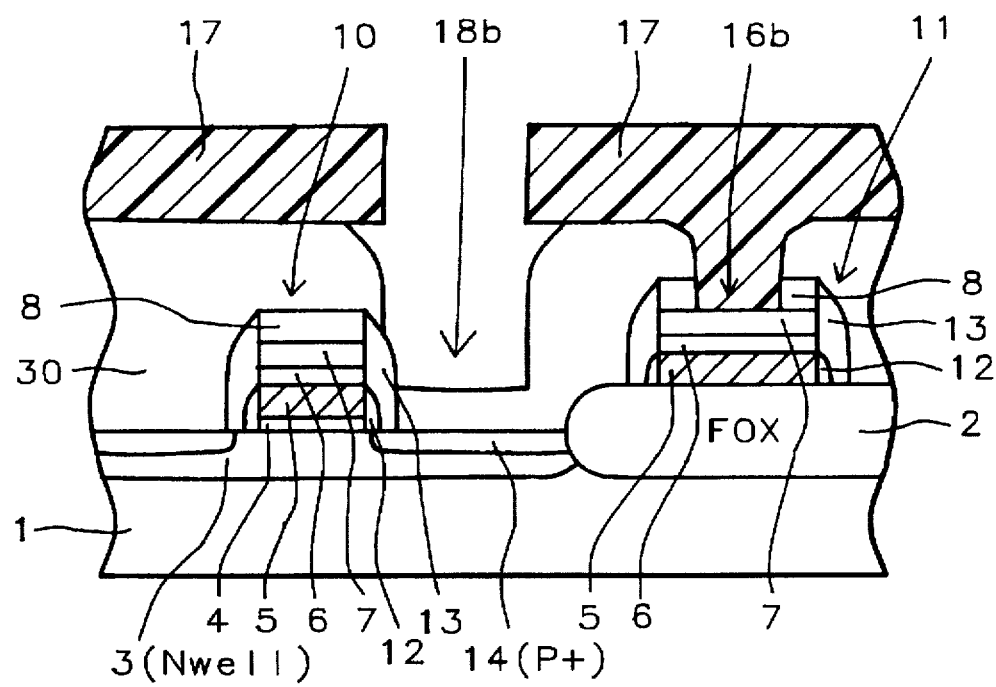

Another photoresist shape 17, is formed to allow a sub-micron diameter opening to source and drain region 14, to be made. The opening will allow a self-aligned contact, (SAC), structure, to be placed in the sub-micron diameter opening, contacting the underlying source and drain region 14. FIG. 7, schematically shows the initial phase for creating the sub-micron diameter, SAC opening 18a, via use of an anisotropic dry, RIE procedure, using $CHF_3$ as an etchant, removing between about 2000 to 9000 Angstroms of ILD layer, 30, resulting in between about 800 to 1200 Angstroms of ILD layer 30, still remaining in the initial phase of sub-micron diameter opening 18a. The final phase for creating the sub-micron diameter SAC opening is performed using a wet etchant, buffered hydrofluoric acid solution, to remove the remaining 800 to 1200 Angstroms of ILD layer 30. The wet etchant phase is performed to create a final phase, sub-micron diameter SAC opening, 18b, with a tapered or sloped profile near the top surface of ILD layer 30. Again this profile will allow improved metal coverage, in sub-micron diameter SAC opening 18b, to be realized, even when using non-CVD metallization procedures. This is schematically shown in FIG. 8. Photoresist shape 17, is again removed using plasma oxygen ashing and careful wet cleans.

Sub-micron diameter, SAC opening, 18b, shown schematically in FIG. 8, is created with a sub-micron diameter, between about 0.5 to 3.0 uM. Sub-micron diameter SAC opening, 18b, is designed to overlap silicon nitride spacer, 13, thus allowing the area of source and drain region, 14, needed for contact purposes, to be smaller then the photolithographic dimension, thus allowing device density enhancements to be realized. In addition, the use of silicon nitride as spacers, allows the completion of sub-micron diameter SAC opening, 18b, to progress in a buffered hydrofluoric acid solution, without risking spacer degradation.

Figure 9:
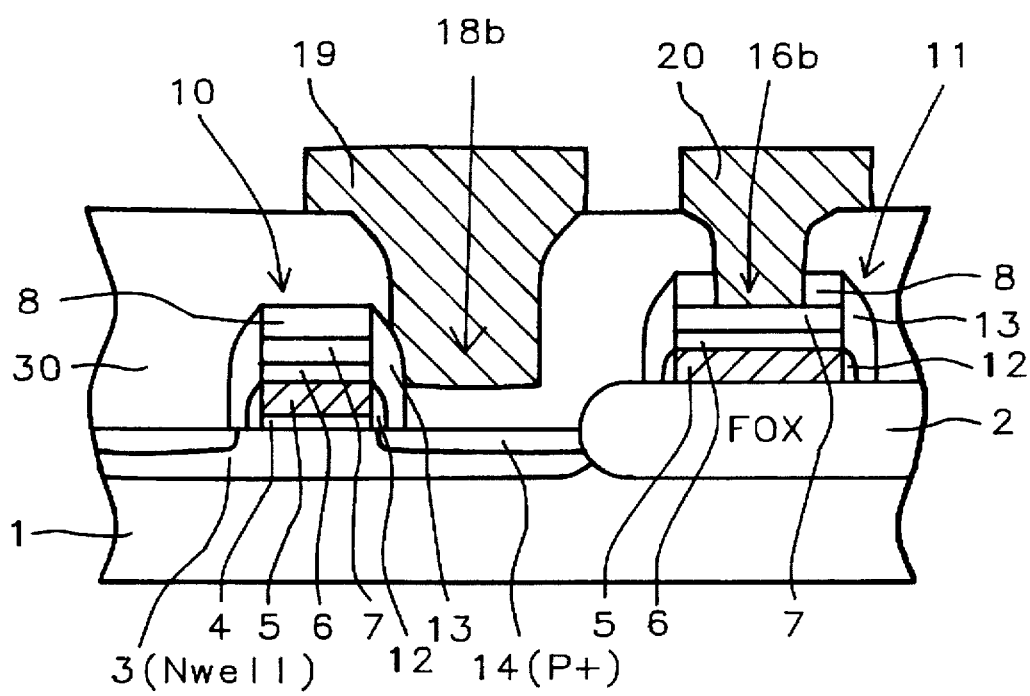

Metal structures 19 and 20, are next formed, and schematically shown in FIG. 9. A pre-metal deposition clean, comprised of exposure to a buffered hydrofluoric acid solution is first performed, removing any residual ILD layer 30, that may have been intentionally left in capacitor contact opening 16b, during the final, dry etching phase. Next a layer of aluminum is deposited using r.f. sputtering. The aluminum layer may contain between about 1 to 3% copper, and may contain between about 0.5 to 2% silicon. Patterning to create the metal structures 19 and 20, is performed using conventional photolithographic and anisotropic RIE procedures, using $Cl_2$ as an etchant. The masking photoresist layer is again removed via plasma oxygen ashing and careful wet clean processes. The SAC metal structure 19, contacts source and drain region, 14, while metal structure 20, serves as the upper electrode shape of capacitor structure 11, lying on the top surface of the composite capacitor dielectric layer of silicon nitride 7, silicon oxide 6. For both cases the tapering of the contact openings, resulting from an etching procedure, using a wet etch phase, allows adequate conformality of the aluminum based metal structures.

While this invention has been particularly shown and described with reference to, the preferred embodiments thereof, it will be understood by those skilled in the art that various changes in form and details may be made without departing from the spirit and scope of this invention.

What is claimed is:

1. A fabrication procedure for integrating a MOSFET device, and of a capacitor structure, on a semiconductor substrate, comprising the steps of:

forming field oxide regions in said semiconductor substrate;

forming a well region, in an area of said semiconductor substrate, to be used for said MOSFET device;

growing a gate insulator layer on said semiconductor substrate;

forming a doped polysilicon layer on said FOX regions, and on said gate insulator layer;

growing a capacitor silicon oxide layer on said polysilicon layer;

depositing a capacitor silicon nitride layer on said capacitor silicon oxide layer;

depositing a first silicon oxide layer on said capacitor silicon nitride layer;

patterning to create a polysilicon gate structure, on said gate insulator layer, comprised of said first silicon oxide layer, said capacitor silicon nitride layer, said capacitor silicon oxide layer, and said polysilicon layer;

patterning to create a lower electrode shape, for said capacitor structure, on a FOX region, comprised of said first silicon oxide layer, said capacitor silicon nitride layer, said capacitor silicon oxide layer, and said polysilicon layer;

growing a thin sidewall silicon oxide layer, on the exposed polysilicon sides of said polysilicon gate structure, and on exposed polysilicon sides of said lower electrode shape;

forming silicon nitride spacers on the sides of said polysilicon gate structure, and on the sides of said lower electrode shape;

forming source and drain regions for said MOSFET device;

forming a planarized interlevel dielectric layer, comprised of an underlying, undoped silicon oxide layer, and an overlying, doped silicon oxide layer;

creating a capacitor contact opening in said interlevel dielectric layer, and in said first silicon oxide layer, using a etching procedure comprised of an initial wet etch procedure, followed by a final dry etch procedure, exposing said capacitor silicon nitride layer, overlying said lower electrode shape, and defining an area for an upper electrode shape for said capacitor structure;

creating a sub-micron diameter SAC opening, in said interlevel dielectric layer, with SAC opening exposing an area of said source and drain region, and partially extending over said polysilicon gate structure, of said MOSFET device, with said SAC opening formed using an etching procedure consisting of an initial anisotropic dry etch procedure, followed by a final wet etch procedure;

forming a metal self-aligned contact, (SAC), structure, in said SAC opening, contacting underlying, said source and drain regions, of said MOSFET device; and forming an upper electrode shape for said capacitor structure.

2. The method of claim 1, wherein said gate insulator layer is silicon dioxide, thermally grown in an oxygen–steam ambient, at a temperature between about 850° to 1000° C., to a thickness between about 50 to 200 Angstroms.

3. The method of claim 1, wherein said doped polysilicon layer is deposited using LPCVD procedures, at a temperature between about 550° to 650° C., to a thickness between about 2000 to 4000 Angstroms.

4. The method of claim 1, wherein said capacitor silicon oxide layer is thermally grown, in an oxygen–steam ambient, at a temperature between about 850° to 950° C., to a thickness between about 50 to 250 Angstroms.

5. The method of claim 1, wherein said capacitor silicon nitride layer is deposited using LPCVD or PECVD procedures, at a temperature between about 700 to 850° C., to a thickness between about 200 to 1000 Angstroms.

6. The method of claim 1, wherein said silicon nitride spacers are created from a silicon nitride layer, deposited using LPCVD or PECVD procedures, at a temperature between about 700° to 850° C., to a thickness between about 1000 to 3000 Angstroms.

7. The method of claim 1, wherein said silicon nitride Spacers are formed via anisotropic RIE of a silicon nitride layer, using $SF_6$ or $CHF_3$ as an etchant.

8. The method of claim 1, wherein said source and drain regions are formed via a first conductivity imparting dopant of $B^{11}$ or $BF_2$, ion implanted at an energy between about 20 to 40 KeV, at a dose between about 8E14 to 6E15 atoms/$cm^2$.

9. The method of claim 1, wherein said interlevel dielectric, (ILD), layer is comprised of an underlying layer of said undoped, silicon oxide, and an overlying layer of said doped silicon oxide, with said doped silicon oxide comprised of boro-phosphosilicate glass, deposited using PECVD procedures, at a temperature between about 300° to 500° C., to a thickness between about 3000 to 10000 Angstroms.

10. The method of claim 1, wherein said capacitor contact opening is formed in said ILD layer, and in said first silicon oxide layer, via an etching procedure comprised of an initial wet etch, using a buffered hydrofluoric acid solution, and a final anisotropic RIE procedure, using $CHF_3$ as an etchant.

11. The method of claim 1, wherein said SAC opening, is created in said ILD layer via an etching procedure comprised of an initial anisotropic RIE procedures, using $CHF_3$ as an etchant, followed by a final wet etch, using a buffered hydrofluoric acid solution, forming said SAC opening with a diameter between about 0.50 to 3.0 uM.

12. The method of claim 1, wherein said SAC structure, and said upper electrode shape of said capacitor structure, are comprised of an aluminum layer, containing between about 1 to 3% copper, and between about 0.5 to 2% silicon.

13. A fabrication process for integrating a MOSFET device and a capacitor structure, on a semiconductor substrate, with a self-aligned contact, (SAC), opening, to a source and drain region of said MOSFET device, and a capacitor contact opening, to a capacitor structure, both having a sloped profile in an insulator layer, comprising the steps of:

forming field oxide regions in said semiconductor substrate;

forming an N well region in an area of said semiconductor substrate, to be used for said MOSFET device;

growing a silicon dioxide gate insulator layer on said semiconductor substrate;

depositing a polysilicon layer on said silicon dioxide gate insulator layer, and on said FOX regions;

doping said polysilicon layer;

growing a silicon oxide capacitor layer on said polysilicon layer;

depositing a silicon nitride capacitor layer on said silicon oxide capacitor layer;

depositing a first silicon oxide layer on said silicon nitride capacitor layer;

patterning of said first silicon oxide layer, of said silicon nitride capacitor layer, of said silicon oxide capacitor layer, and of said polysilicon layer, to create a polysilicon gate structure, for said MOSFET device, on said silicon oxide gate insulator layer;

patterning of said first silicon oxide layer, of said silicon nitride capacitor layer, of said silicon oxide capacitor layer, and of said polysilicon layer, to create a lower electrode shape, for said capacitor structure, on said field oxide region;

growing a sidewall silicon oxide layer on the exposed polysilicon sides of said polysilicon gate structure, and on the exposed polysilicon sides of said lower electrode shape, for said capacitor structure;

depositing a sidewall silicon nitride layer;

anisotropic etching of said sidewall silicon nitride layer, to form said silicon nitride spacers on the sides of said polysilicon gate structure, of said MOSFET device, and to form said silicon nitride spacers on the sides of said lower electrode shape, for said capacitor structure;

ion implanting a first conductivity imparting dopant into a region of said semiconductor substrate, not covered by said polysilicon gate structure, and not covered by said FOX regions, to create source and drain regions, for said MOSFET device;

depositing an interlevel dielectric, (ILD) layer, comprised of an underlying, undoped silicon oxide layer, and an overlying layer of doped silicon oxide;

planarizing said ILD layer;

creating said capacitor contact opening in said ILD layer, and in said first silicon oxide, with said capacitor contact opening having a sloped profile, obtained via use of an etching sequence comprised of an initial wet etch procedure, followed by a selective, anisotropic RIE etch, exposing said silicon nitride capacitor layer, on said lower electrode shape, of said capacitor structure;

creating a sub-micron, SAC opening, in said ILD layer, exposing an area of said source and drain region, and partially extending over said polysilicon gate structure, with said SAC opening having a sloped profile, obtained via use of an etching sequence comprised of an initial anisotropic RIE etch, followed by a final wet etch procedure;

depositing a metal layer;

patterning of said metal layer, forming said SAC structure, in said SAC opening, contacting said source and drain region, of said MOSFET device; and patterning of said metal layer, forming said upper electrode shape, for said capacitor structure.

14. The method of claim 13, wherein said silicon dioxide gate insulator layer is thermally grown, in an oxygen steam ambient, at a temperature between about 850° to 1000° C., to a thickness between about 50 to 200 Angstroms.

15. The method of claim 13, wherein said polysilicon layer is deposited using LPCVD procedures, at a temperature between about 550° to 650° C., to a thickness between about 2000 to 4000 Angstroms.

16. The method of claim 13, wherein said silicon oxide capacitor layer is thermally grown, in an oxygen–steam ambient, at a temperature between about 850° to 950° C., to a thickness between about 50 to 250 Angstroms.

17. The method of claim 13, wherein said silicon nitride capacitor layer is deposited via LPCVD or PECVD procedures, at a temperature between about 700° to 850° C., to a thickness between about 200 to 1000 Angstroms.

18. The method of claim 13, wherein said first silicon oxide layer is deposited using LPCVD or PECVD procedures, at a temperature between about 500° to 800° C., to a thickness between about 100 to 1000 Angstroms, using TEOS as a source.

19. The method of claim 13, wherein said interlevel dielectric layer, is deposited using PECVD procedures, at a temperature between about 300° to 500° C., to a thickness between about 3000 to 10000 Angstroms, and is comprised of an underlying, said undoped silicon oxide layer, and an overlying layer of boro-phosphosilicate glass.

20. The method of claim 13, wherein said capacitor contact opening, exhibiting a sloped profile, is formed in said ILD layer, and in said first silicon oxide layer, via an etching sequence comprising an initial wet etch procedure, using a buffered hydrofluoric acid solution, and a final selective, anisotropic RIE procedure, using $CHF_3$ as an etchant.

21. The method of claim 13, wherein said SAC opening is created in said ILD layer via an etching sequence comprised of an initial anisotropic RIE procedure, using $CHF_3$ as an etchant, followed by a final wet etch procedure, using a buffered hydrofluoric acid solution, forming said SAC opening with a diameter between about 0.5 to 3.0 uM.

22. The method of claim 13, wherein said SAC structure, of said MOSFET device, and said upper electrode shape, of said capacitor structure, are comprised of an aluminum layer, containing between about 1 to 3% copper, and between about 0.5 to 2% silicon.

* * * * *